(12) United States Patent
Yim et al.

(10) Patent No.: US 6,326,553 B1
(45) Date of Patent: Dec. 4, 2001

(54) SCHEME TO AVOID ELECTROSTATIC DISCHARGE DAMAGE TO MR/GMR HEAD GIMBAL/STACK ASSEMBLY IN HARD DISK APPLICATIONS

(75) Inventors: Pyongwon Yim, Sunnyvale; Andrew S. Kao, Fremont; Hyung Jai Lee, Cupertino, all of CA (US)

(73) Assignee: Samsung Electronics, Co., Ltd (KR)

( * ) Notice: Subject to any disclaimer, the term of this patent is extended or adjusted under 35 U.S.C. 154(b) by 0 days.

(21) Appl. No.: 09/353,249

(22) Filed: Jul. 14, 1999

Related U.S. Application Data
(60) Provisional application No. 60/104,484, filed on Oct. 16, 1998.

(51) Int. Cl.[7] .................................................. H05K 3/32
(52) U.S. Cl. ........................ 174/254; 174/255; 174/260; 174/268; 361/749; 361/685; 361/684; 360/97.1; 360/105; 360/108
(58) Field of Search ................................... 174/254, 255, 174/260, 268, 74 R, 78; 361/749, 751, 685, 684, 686, 760, 764; 360/97.1, 105, 108

(56) References Cited

U.S. PATENT DOCUMENTS

| | | | | |
|---|---|---|---|---|
| 5,055,969 | * | 10/1991 | Putnam | 361/749 |
| 5,422,764 | * | 6/1995 | McIlvanie | 360/97.01 |
| 5,499,161 | * | 3/1996 | Hosseinzadeh et al. | 361/749 |
| 5,583,720 | * | 12/1996 | Ishida et al. | 360/97.01 |
| 5,737,837 | * | 4/1998 | Inaba | 29/884 |
| 5,757,582 | * | 5/1998 | White et al. | 360/98.01 |
| 6,078,473 | * | 6/2000 | Crane et al. | 360/104 |

\* cited by examiner

*Primary Examiner*—Leo P. Picard
*Assistant Examiner*—David Foster
(74) *Attorney, Agent, or Firm*—Irell & Manella, LLP

(57) ABSTRACT

A flexible circuit board which can be assembled into a head gimbal assembly of a hard disk drive. The flexible circuit board may have a conductive tab that is electrically connected to a pre-amp pad and a head pad of the circuit board. The head pad may be connected to a head. The conductive tab may be grounded during handling of the flexible circuit board. Any electrostatic discharge on the head may be grounded through the conductive tab.

18 Claims, 3 Drawing Sheets

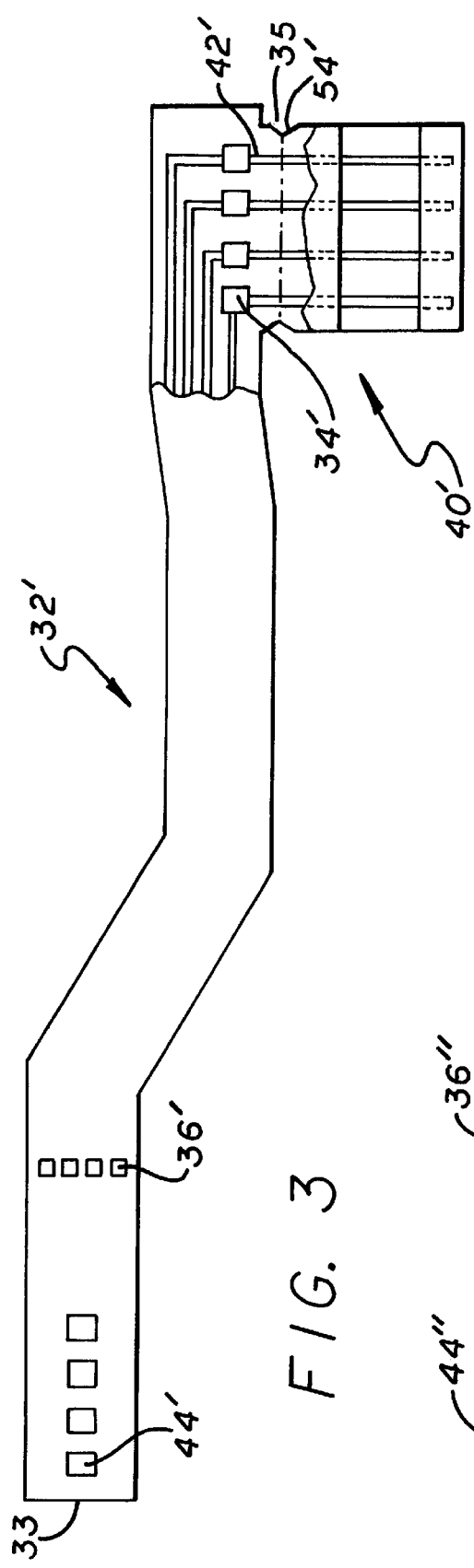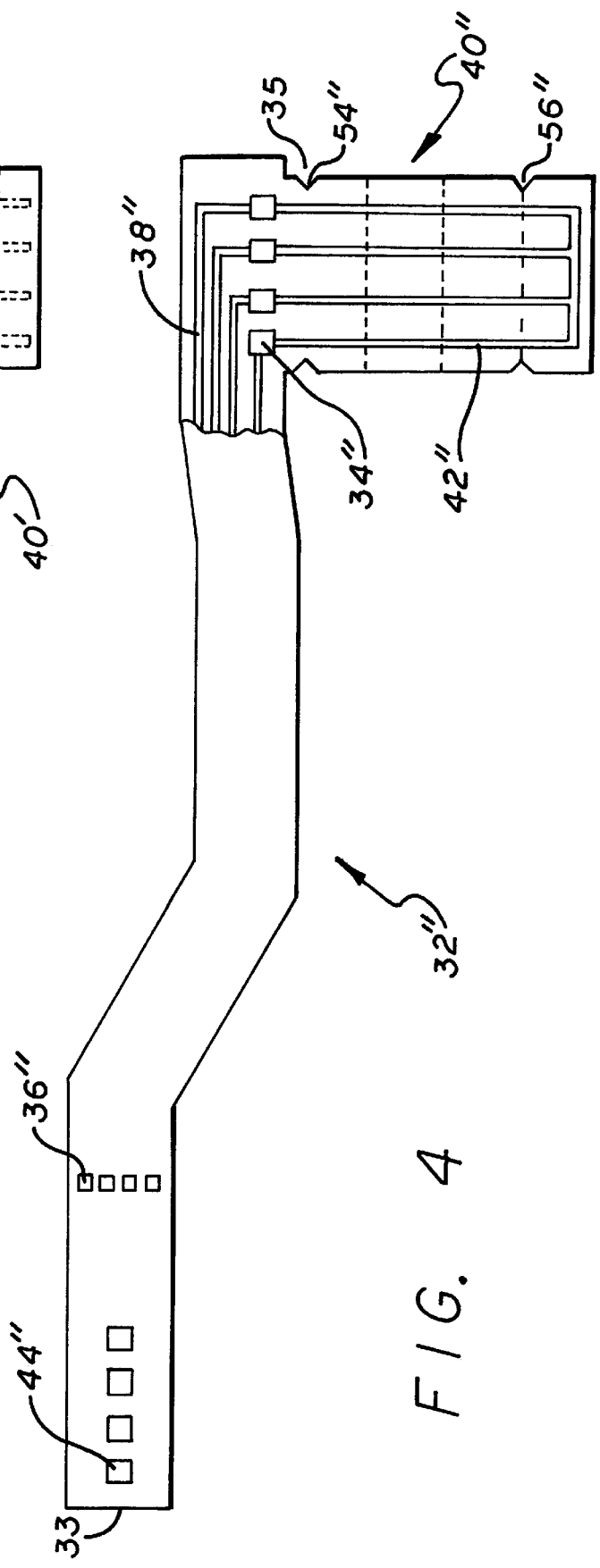

SCHEME TO AVOID ELECTROSTATIC DISCHARGE DAMAGE TO MR/GMR HEAD GIMBAL/STACK ASSEMBLY IN HARD DISK APPLICATIONS

CROSS-REFERENCE TO RELATED APPLICATIONS

This application claims the benefit of U.S. Provisional Application No. 60/104,484, filed Oct. 16, 1998.

BACKGROUND OF THE INVENTION

1. Field of the Invention

The present invention relates to a technique for grounding a flexible circuit board that can be assembled into a head gimbal assembly of a hard disk drive.

2. Background Information

Hard disk drives typically contain a plurality of heads that are magnetically coupled to a number of rotating disks. The heads can both magnetize and sense the magnetic fields of the disks, to store and retrieve data as is known in the art.

Each head is typically gimbal mounted to the end of a corresponding suspension arm. The suspension arms are attached to an actuator arm assembly. The actuator arm assembly includes a voice coil motor that can swing the arm and move the heads across the surfaces of the disks. The data is typically stored within annular tracks that extend radially across the surfaces of the disks. The voice coil motor moves the actuator and suspension arms so that the heads can access the different tracks.

There are various types of magnetic recording heads including magneto-resistive ("MR") and giant magneto-resistive ("GMR") heads. MR and GMR heads contain a write element for magnetizing a corresponding disk surface and a separate read element for sensing the magnetic fields of the disks. The heads are connected to electrical circuits that excite the write elements and sense a voltage across the read elements.

The heads may be connected to the electrical circuits by a flexible circuit board that is attached to the suspension arm. The flexible circuit board typically has a plurality of conductive pre-amp pads that are connected to a pre-amplifier and a number of conductive head pads that are connected to a head. The pre-amp pads are coupled to the head pads by a plurality of conductive traces that extend along a dielectric substrate of the flexible circuit board. The dielectric substrate is typically constructed from a flexible material such as a polyimide.

It is desirable to test the heads before installation into the disk drive assembly. The heads are typically assembled to the flexible circuit board and then manually loaded into a dynamic head tester. It has been found that manually loading the heads may result in an electrostatic discharge ("ESD") that may damage the read and write elements. MR and GMR are heads are particularly sensitive to ESD events. It would be desirable to provide a flexible circuit board and assembly process which reduces the likelihood of head damage from an electrostatic discharge.

SUMMARY OF THE INVENTION

One embodiment of the present invention is a flexible circuit board that can be assembled into a head gimbal assembly of a hard disk drive. The flexible circuit board may have a conductive tab that is electrically connected to a pre-amp pad and a head pad of the circuit board. The conductive tab may be grounded during handling of the flexible circuit board.

BRIEF DESCRIPTION OF THE DRAWINGS

FIG. 3 is a top view of an alternate embodiment of the flexible circuit board;

FIG. 4 is a top view of an alternate embodiment of the flexible circuit board;

DETAILED DESCRIPTION

Figure 1:
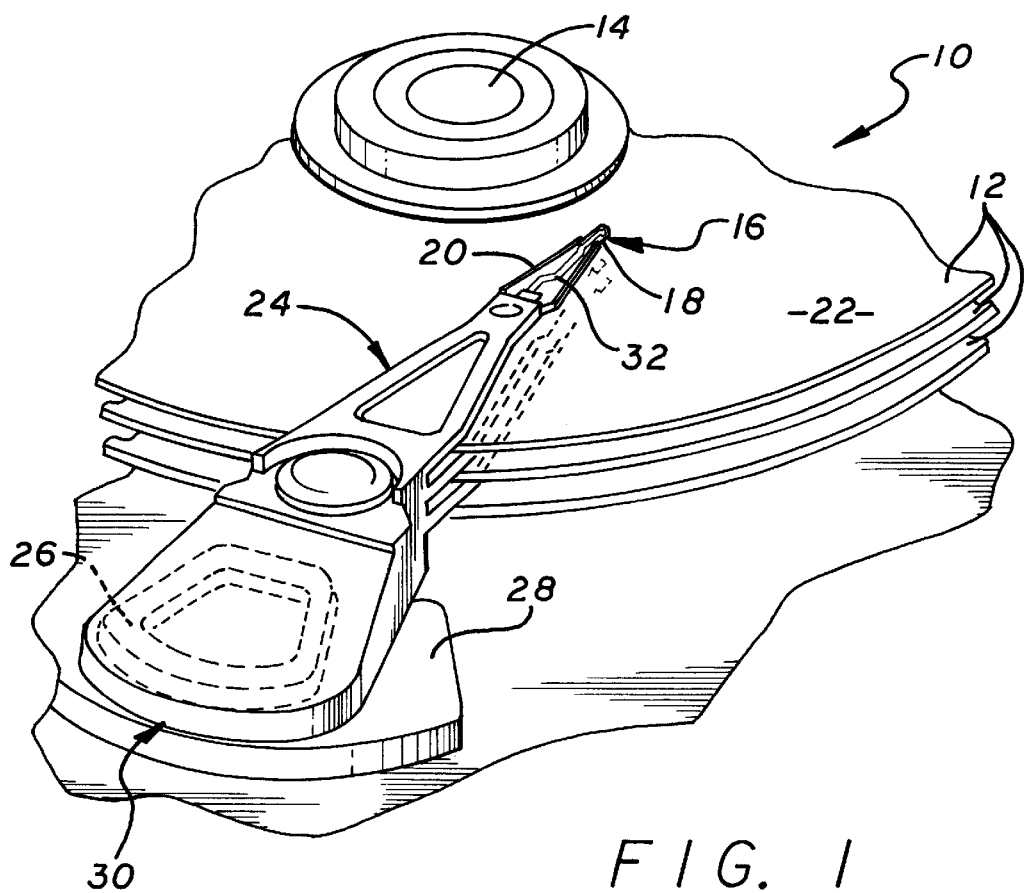
FIG. 1 is a perspective view of an embodiment of a hard disk drive of the present invention.

Referring to the drawings more particularly by reference numbers, FIG. 1 shows an embodiment of a hard disk drive 10 of the present invention. The disk drive 10 may include one or more disks 12 that are rotated by a spindle motor 14. The disks 12 rotate relative to a plurality of head gimbal assemblies 16 (HGA's). Each HGA 16 includes a head 18 that is gimbal mounted to a suspension arm 20 and coupled to a disk surface 22.

The suspension arms 20 are attached to an actuator arm 24. A voice coil 26 is attached to the actuator arm 24 and coupled to a magnet assembly 28. The voice coil 26 and magnet assembly 28 are commonly referred to as a voice coil motor 30. The voice coil 26 is connected to an electrical circuit (not shown). The circuit can provide a current which excites the voice coil motor 30 to swing the actuator arm 24 and move the heads 18 across the disk surfaces 22.

Figure 2:
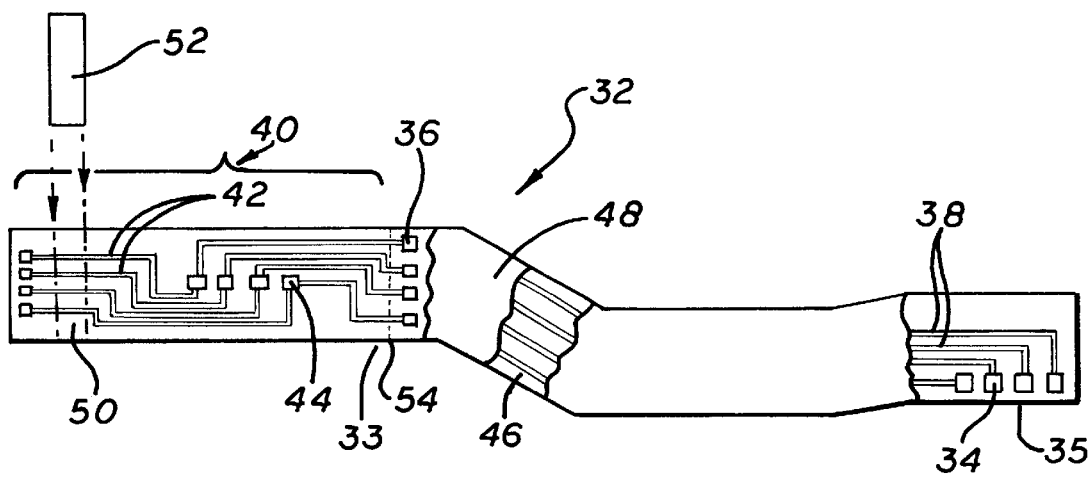
FIG. 2 is a top view of an embodiment of a flexible circuit board of the hard disk drive.

Each HGA 16 may have a flexible circuit board 32 that is mounted to a suspension arm 20 and electrically connects a head 18 to a pre-amplifier circuit (not shown). FIG. 2 shows an embodiment of a flexible circuit board 32, having a first end 33 and a second end 35, before the board 32 is attached to a suspension arm. The flexible circuit board 32 may include a plurality of conductive head pads 34 and a plurality of pre-amp pads 36. The head pads 34 may be connected to corresponding pads of a head (not shown). The pre-amp pads 36 may be connected to the pre-amplifier circuit. The pre-amp pads 36 may be connected to the head pads 34 by a plurality of conductive traces 38. There is typically a pair of traces 38, and pads 34 and 36 connected to a read element of a head, and a pair of pads 34 and 36, and traces 38 connected to a write element of the head. Although four sets of pads 34 and 36, and traces 38 are shown and described, it is to be understood that the flexible circuit board 32 may have any number of traces 38, and pads 34 and 36.

The flexible circuit board 32 may have a conductive tab 40 that is electrically connected to the head 34 and pre-amp 36 pads. The conductive tab 40, which in this embodiment extends from first end 33, may include a plurality of traces 42 that are connected to a plurality of test pads 44. The test pads 44 may be connected to the pre-amp pads 36. The pads 34, 36 and 44, and traces 38 and 42 may be etched from a conductive sheet that is attached to a dielectric substrate 46. The dielectric substrate 46 may be constructed from a flexible material such as a polyimide. Portions of the traces 38 and 42 may be covered with a top layer of dielectric material 48. The top layer 48 may have a window 50 which exposes a portion of the traces 42 within the conductive tab 40.

A grounding clip 52 can be coupled to the exposed traces 42 of the conductive tab 40 to electrically ground a head (not shown) that is connected to the head pads 34. Grounding the conductive tab 40 will shunt an electrostatic discharge that is applied to the head or circuit board 32 and prevent damage to the read and write elements within the head. The ground clip 52 may be coupled to the conductive tab 40 while being handled by either personnel or equipment to prevent head damage due to an ESD event.

The ground clip 52 may be attached to the conductive pad 40 while the head is being handled by an operator who loads the circuit board/head assembly into a dynamic head tester (not shown). The head tester typically has a plurality of test probes (not shown) that are pressed onto the test pads 44. An operator may remove the ground clip 52 after the circuit board/head assembly is loaded to allow electrical testing of the head. After the test is completed the clip 52 may be reattached to the conductive tab 40 so that the flexible circuit 32 can be removed from the tester. The clip 52 is detached from the traces 42 and the flexible circuit board 32 may be cut along a trim line 54 to remove the test pads 44 and the conductive tab 40 so that the circuit board 32 can be assembled into a disk drive.

FIG. 3 shows an alternate embodiment of a flexible circuit board 32' which has a conductive tab 40' that extends from the head pad end (second end 35) of the circuit board 32' and can be coupled to a ground clip (not shown). The conductive tab 40' may have traces 42' that are connected to head pads 34'. The head pads 34' may be connected to pre-amp pads 36' and test pads 44' by traces 38'. The tab 40' can be removed by cutting along the trim line 54'. The flexible circuit board 32' can be used in the same manner as the circuit board 32 shown in FIG. 2.

FIG. 4 shows yet another alternate embodiment of a flexible circuit board 32" which has a conductive tab 40" extending from second end 35 along with pads 34", 36", 44" and traces 38". The conductive tab 40" may have traces 42" that are connected to the head pads 34". The traces 42" can be connected together so that the read and write elements of the head are shorted together even when a grounding clip is not coupled to the traces 42". The conductive tab 40" may have a first trim line 54" and a second trim line 56". The conductive tab 40" may be cut along the second trim line 56" before the head is tested to disconnect the traces 42". After the head is tested, the tab 40" may be removed by cutting along the first trim line 54".

Figure 5:
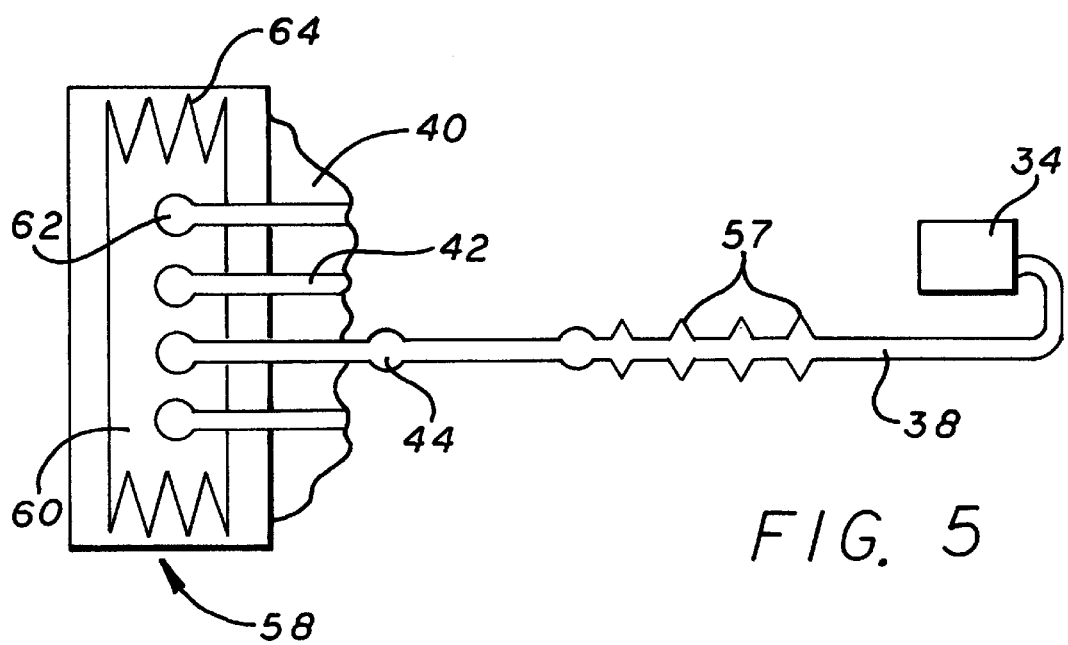
FIG. 5 is a top enlarged view of a flexible circuit board coupled to a conductive carrier tape.

FIG. 5 shows an alternate embodiment of a trace 38 which has one or more tips 57 extending therefrom and which is connected to a head sensor 34. The tips 57 provide focused conductive points which provide a "lightening rod" effect for an electrostatic discharge. The traces 42 of the conductive tab 40 can be coupled to pads 44 and to a carrier module 58 instead of a grounding clip. The carrier module 58 may be constructed from a stiff or flexible material which allows an operator to hold and move a flexible circuit board and the accompanying head. The carrier 58 may have a single ground plane 60 that is coupled to corresponding pads 62 of the traces 42. The ground plane 60 may also have tips 64 to attract electrostatically discharged energy.

Figure 6:
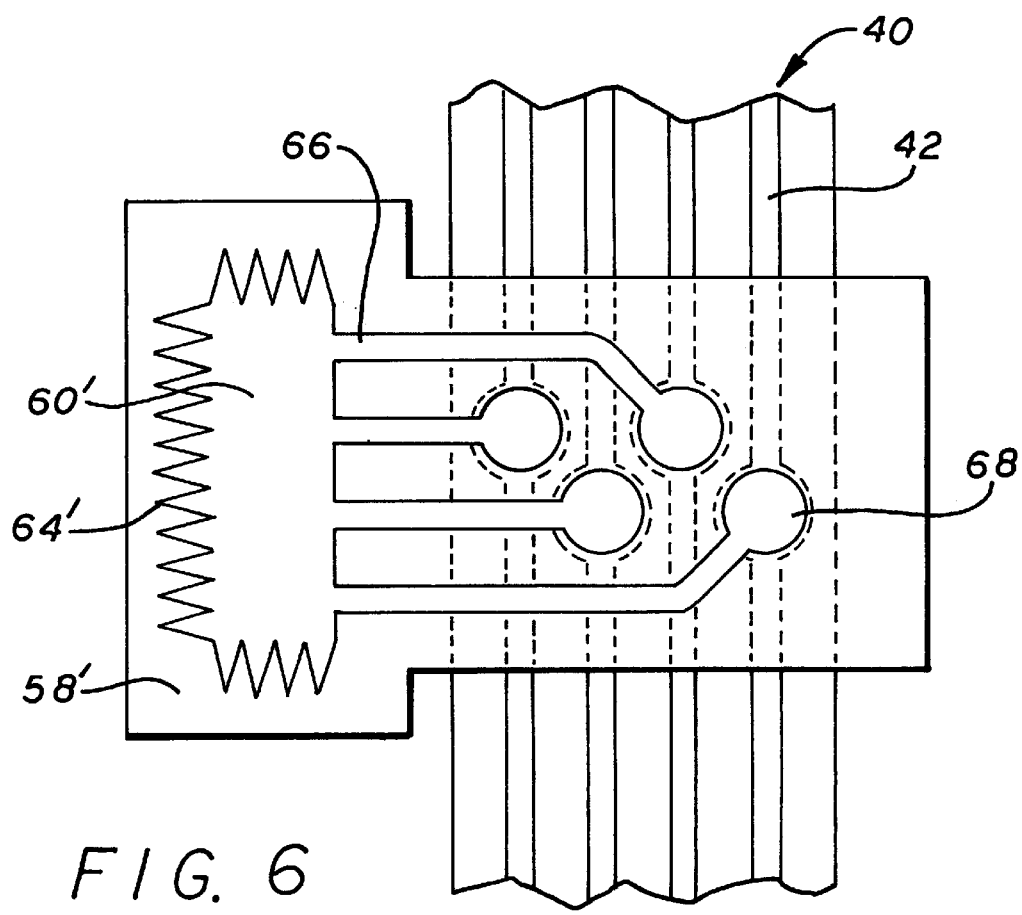
FIG. 6 is as top enlarged view of a flexible circuit board coupled to an alternate embodiment of the conductive carrier tape.

FIG. 6 shows another carrier module 58' which has a plurality of traces 66 and corresponding pads 68 that are coupled to the traces 42 of the conductive tab 40. The traces 64 may be connected to a ground plane 60' which has tips 64'.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A flexible circuit board for a head gimbal assembly of a hard disk drive, comprising:
   a substrate which has a first end and a second end;
   a head pad on said substrate;
   a pre-amp pad on said substrate; and,
   a conductive tab that is electronically connected to said head and pre-amp pads, said conductive tab to include a first trim line.

2. The flexible circuit board of claim 1, wherein said conductive tab extends from said first end of said substrate.

3. The flexible circuit board of claim 1, wherein said conductive tab extends from said second end of said substrate.

4. The flexible circuit board of claim 1, wherein said conductive tab includes a conductive trace that is electrically connected to said head and pre-amp pads.

5. The flexible circuit board of claim 1, wherein said conductive tab includes a second trim line.

6. The flexible circuit board of claim 1, further comprising a conductive trace that is electrically connected to said head and pre-amp pads, said conductive trace having a tip.

7. The flexible circuit board of claim 1, further comprising a grounding clip that is electrically connected to said conductive tab.

8. The flexible circuit board of claim 1, further comprising a carrier module that is electrically connected to said conductive tab.

9. The flexible circuit board of claim 1, further comprising a test pad that is electrically connected to said head and pre-amp pads.

10. A method for handling a flexible circuit board that can be assembled into a head gimbal assembly of a hard disk drive, comprising:
    providing a flexible circuit board which has a head pad, pre-amp pad, and a conductive tab that is electrically connected to the head and pre-amp pads;
    coupling the conductive tab to a grounding element; and,
    handling the flexible circuit board by an operator.

11. The method of claim 10, further comprising:
    detaching the conductive tab after handling the flexible circuit board by an operator.

12. A method for testing a head, comprising:
    attaching a head to a head pad of a flexible circuit board which has a pre-amp pad and a conductive tab that are electrically connected to the head pad;
    coupling the conductive tab to a grounding element;
    placing the flexible circuit board and head in a head tester;
    decoupling the grounding elements from the conductive tab; and,
    testing the head.

13. The method of claim 12, further comprising the steps of coupling the grounding element to the conductive tab and removing the flexible circuit board and the head from the head tester.

14. The method of claim 13, further comprising the steps of decoupling the grounding element from the conductive tab, detaching the conductive tab, and assembling the flexible circuit board and the head to a suspension arm.

15. A flexible circuit board for a head gimbal assembly of a hard disk drive, comprising:

a substrate which has a first end and a second end;

a head pad on said substrate;

a pre-amp pad on said substrate;

a conductive tab that is electronically connected to said head and pre-amp pads; and, a conductive trace that is electrically connected to said head and pre-amp pads, said conductive trace having a tip.

16. A flexible circuit board for a head gimbal assembly of a hard disk drive, comprising:

a substrate which has a first end and a second end;

a head pad on said substrate;

a pre-amp pad on said substrate;

a conductive tab that is electronically connected to said head and pre-amp pads; and, a grounding clip that is electrically connected to said conductive tab.

17. A flexible circuit board for a head gimbal assembly of a hard disk drive, comprising:

a substrate which has a first end and a second end;

a head pad on said substrate;

a pre-amp pad on said substrate;

a conductive tab that is electronically connected to said head and pre-amp pads; and, a carrier module electrically connected to said conductive tab.

18. A flexible circuit board for a head gimbal assembly of a hard disk drive, comprising:

a substrate which has a first end and a second end;

a head pad on said substrate;

a pre-amp pad on said substrate;

a conductive tab that is electronically connected to said head and pre-amp pads; and, a test pad that is electrically connected to said head and pre-amp pads.

* * * * *